United States Patent [19]

Smedt et al.

[11] Patent Number: 5,043,589
[45] Date of Patent: Aug. 27, 1991

[54] SEMICONDUCTOR DEVICE INSPECTION APPARATUS USING A PLURALITY OF REFLECTIVE ELEMENTS

[75] Inventors: Rodney Smedt, San Jose; Ian Raphael, Campbell, both of Calif.

[73] Assignee: Trigon/Adcotech, Milpitas, Calif.

[21] Appl. No.: 525,946

[22] Filed: May 18, 1990

[51] Int. Cl.⁵ .......................................... G01N 21/86
[52] U.S. Cl. .................................. 250/561; 356/392
[58] Field of Search ............... 250/216, 561, 571, 572; 356/388, 391, 392, 394; 358/101, 107

[56] References Cited

U.S. PATENT DOCUMENTS

| | | | |
|---|---|---|---|
| 4,269,515 | 5/1981 | Altman | 356/394 |
| 4,471,448 | 9/1984 | Williams | 356/392 |
| 4,855,928 | 8/1989 | Yamanaka | 356/392 |

Primary Examiner—David C. Nelms
Assistant Examiner—S. Allen
Attorney, Agent, or Firm—Rosenblum, Parish & Bacigalupi

[57] ABSTRACT

An improved optical inspection apparatus, especially suited for inspecting semiconductor devices using a single camera. A highly polished mirrored stage is provided with a light source extending upwardly therethrough and providing a pedestal upon which the object to be inspected is centered. A plurality of stationary reflectors are disposed around the stage and function in concert with two separate movable reflectors to provide optical scanning over the appropriate surface portions of the device. A separate movable reflector system is used to maintain a constant focal path length between the device and the camera as the other movable reflectors scan the device, thus ensuring proper focus and measurement accuracy.

23 Claims, 7 Drawing Sheets

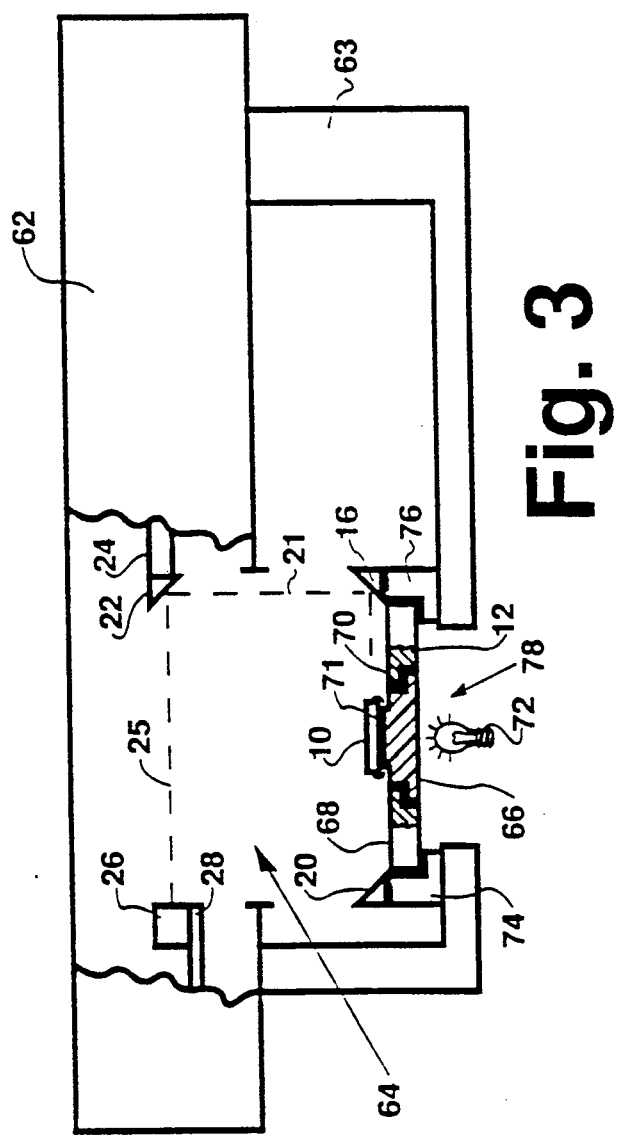

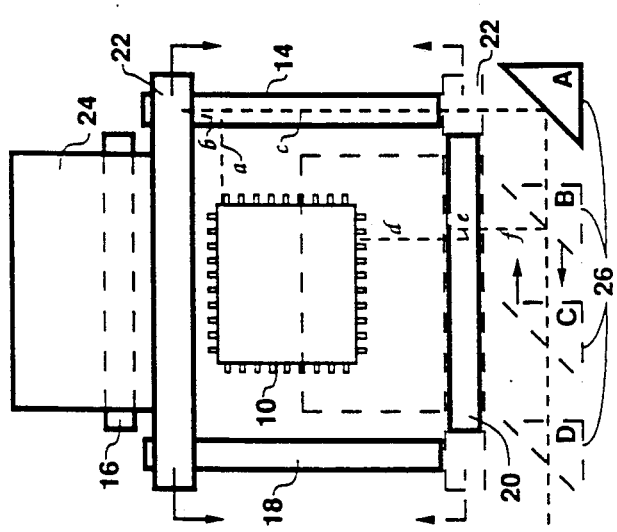
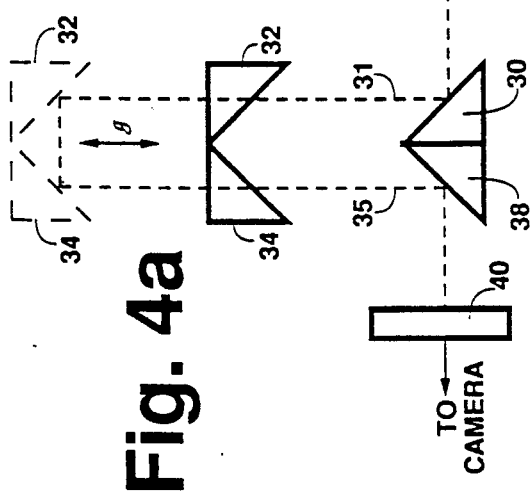
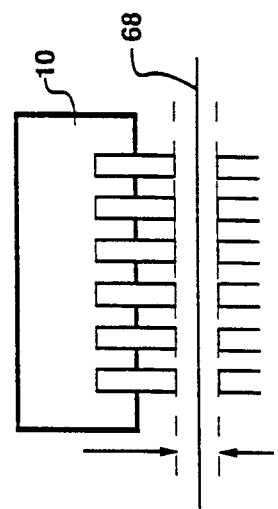
Fig. 4a
Fig. 4b
Fig. 4c

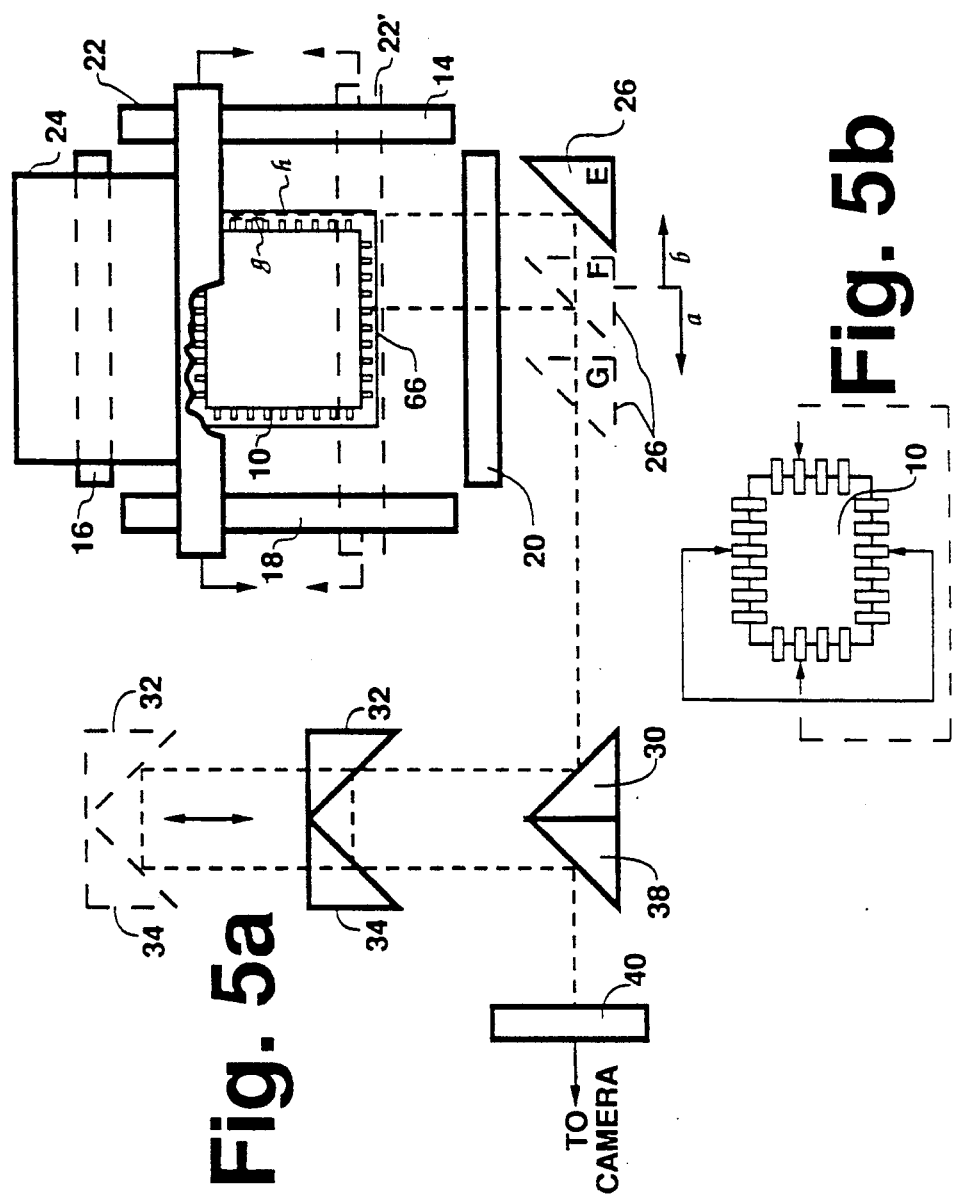

SEMICONDUCTOR DEVICE INSPECTION APPARATUS USING A PLURALITY OF REFLECTIVE ELEMENTS

BACKGROUND OF THE INVENTION

1. Field of the Invention

The present invention relates generally to an apparatus for inspecting semiconductor devices, and more particularly to an improved optical inspection system for the efficient and highly accurate determination of various measurement characteristics of semiconductor devices, such as lead spacing, coplanarity, and tweeze.

2. General Description of Prior Art

The inception and advancement of semiconductor devices has induced a plethora of related technologies and associated product demands. Many of these technologies concern themselves with the inspection of packaged integrated circuits and similar devices in order to determine product compliance within specific ranges of manufacturing and operational parameters. An important segment of these parameters involves ensuring that these devices will make proper electrical contact with a circuit board to which they are normally mounted. Typical examples of such devices are PLCCs, SOJs, SOICs, etc.

Manual inspection of the devices can be achieved by placing the device on a smooth surface and noting any separation between the contact points of any lead from the device and the surface. Visual inspection can also be made by sighting down the row of contact pins and noting excessive variation. However, these types of manual inspections are time consuming and not highly reliable, because of the tolerances and limits involved in the necessary measurements.

A typical example of an apparatus designed to accurately inspect one parameter of packaged semiconductor devices, coplanarity, is disclosed in U.S Pat. No. 4,754,555. The apparatus described therein employs a socket assembly for receiving the packaged semiconductor device and is operative to contact each lead of the package that is within acceptable coplanarity limits and indicate those leads that are not within acceptable limits. Although the device provides accurate coplanarity measurements within certain limits, it has inherent limitations in its use with fine pitch devices. Additionally, this apparatus is effective solely in the measurement of coplanarity, only one of a number of measurements that need to be made in order to ensure proper device function.

Significant improvements in measurement capabilities were achieved by the introduction of an optical scanning apparatus called the SMD 9000 Inspection System, manufactured by Trigon/Adcotech of Milpitas, California. This system uses a multi-camera optical array to determine specific precision measurements for the semiconductor device characteristics of tweeze, lead spacing, and coplanarity. In this apparatus, a semiconductor device is placed on platform that has a mirrored finish. Four cameras are placed facing the sides of the device, and one is placed overhead. The overhead camera is used to measure tweeze, and the four cameras facing the sides of the device are used to measure lead spacing and coplanarity of each of the respective sides. The device is capable of providing highly accurate measurements of tweeze, coplanarity, and lead spacing, even when used with fine pitch devices. However, the optical system components are expensive and highly sensitive. Each camera must be preserved in perfect alignment in order to ensure accurate device measurements. Additionally, the same power must be maintained for each of the respective cameras, and there are unavoidable problems with light intensity and distribution.

SUMMARY OF THE PRESENT INVENTION

It is therefore a principal object of the present invention to provide a novel semiconductor device inspection system which provides highly accurate measurements of subject devices without the complexity, expense and high maintenance required in prior art apparatus.

Another object of the present invention is to provide an apparatus of the type described wherein several different measurements can be made, including tweeze, lead spacing and coplanarity using a single inspection camera.

Another object of the present invention is to provide an apparatus of the type described which provides highly accurate measurements, even when inspecting fine pitch devices.

Another object of the present invention is to provide an apparatus of the type described which automatically maintains the correct focus during various device measurements, thus ensuring the accuracy thereof.

Briefly, a preferred embodiment of the present invention achieves these and other objects by providing an apparatus which optically scans a semiconductor device utilizing a plurality of reflectors in conjunction with a single camera. The semiconductor device is placed on a highly polished mirrored stage and is illuminated from underneath. Four stationary reflectors are situated around the stage and function in concert with two separate movable reflectors to provide optical scanning access over the appropriate surface portions of the device being inspected. A separate movable reflector system is used to maintain a constant focal path length between the device and the camera as the other movable reflectors are scanning the device, thus ensuring proper focus and measurement accuracy.

An important advantage of the present apparatus is that it uses only one camera in measuring each portion of the device when determining tweeze, lead spacing, and coplanarity. This eliminates the alignment, power and light intensity problems associated with a multi-camera inspection system, and materially reduces overall apparatus cost.

Another advantage of the present invention is that it can be used in measuring fine pitch devices with a high level of accuracy.

Another advantage of the present invention is that focal length is automatically maintained during the inspection operation, without moving the camera or device.

These and other advantages of the present invention will no doubt become apparent to those of ordinary skill in the art after having read the following detailed description of the preferred embodiments illustrated in the several figures of the drawing.

IN THE DRAWING

FIG. 3 is an elevational view detailing the stage orientation and device illumination method in accordance with the present invention.

FIG. 4a is a top plan view detailing the movable components of the present invention and illustrating the process of measuring coplanarity and lead spacing of a semiconductor device.

FIG. 4b is an elevational view of a typical semiconductor device, illustrating the measurement of lead spacing.

FIG. 4c is an elevational view of a typical semiconductor device and its reflection on the stage surface, illustrating the measurement of coplanarity.

FIG. 5a is top plan view detailing the movable components of the present invention and illustrating the process of measuring the tweeze of a semiconductor device.

FIG. 5b is a top plan view of a typical semiconductor device, illustrating the measurement of tweeze.

FIG. 7b is a cross-sectional view of the stage and stationary mirror shown in FIG. 7a.

DETAILED DESCRIPTION OF THE PREFERRED EMBODIMENT

Figure 1:
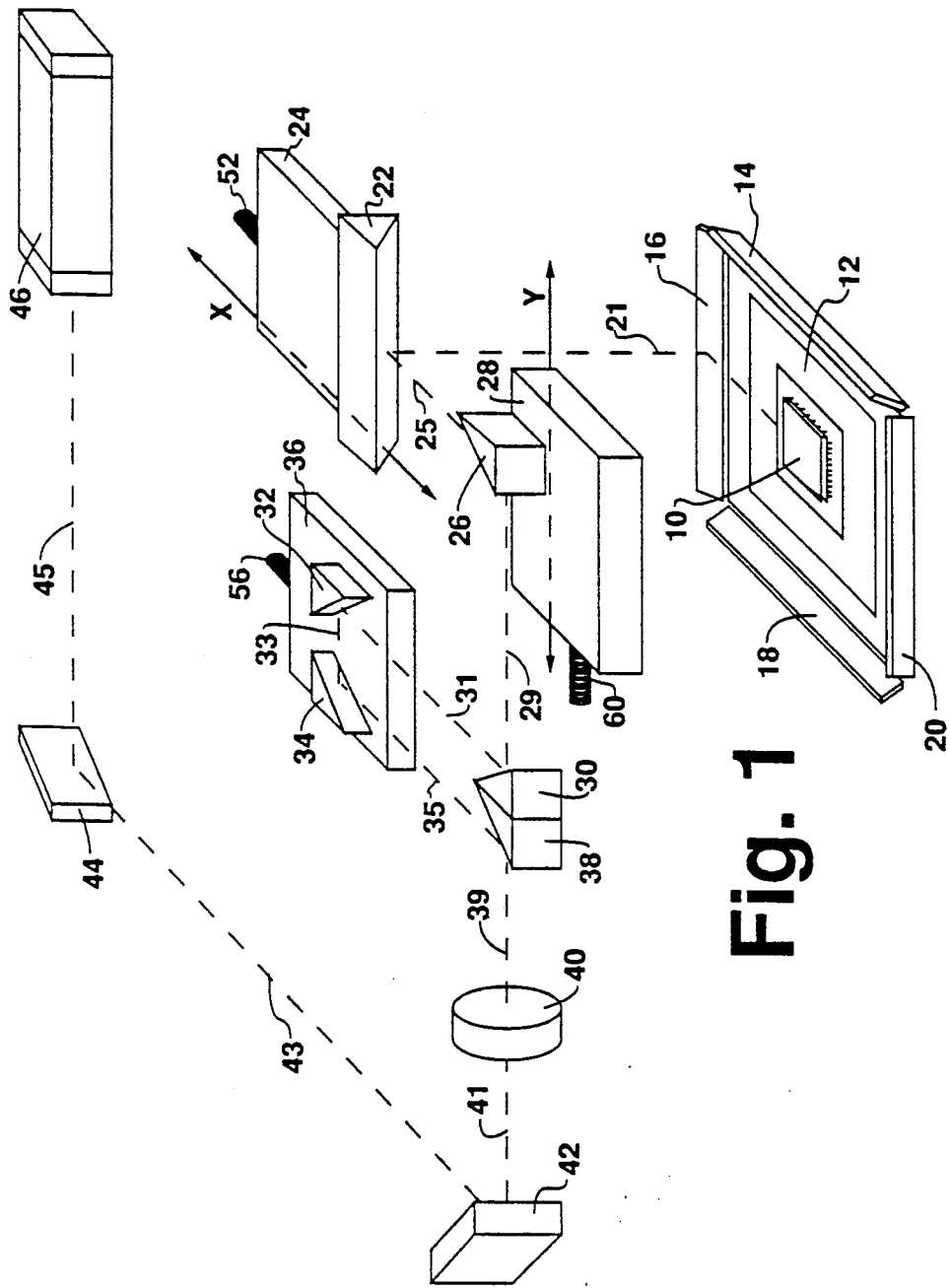
FIG. 1 is a suspended perspective view showing the optical components of the preferred embodiment of the present invention.

Referring to FIG. 1 of the drawing, shown are the optical components of the preferred embodiment and their functional interrelationships. A packaged semiconductor device 10 is positioned on a highly polished reflecting stage or platform 12, described in detail below, which is surrounded by four stationary planar reflectors 14, 16, 18, and 20. Reflectors 14, 16, 18, and 20 are each oriented at equal angles with respect to the stage 12, such that light, transmitted to the planar reflectors directly from a light source positioned beneath the device or reflected from the stage surface, is, after reflection from the face thereof, directed vertically upward along an optical axis segment 21, the position of which is changeable as will be described below.

Movable reflector 22 is attached to a slide 24 and is positioned above stage 12 and reflectors 14, 16, 18 and 20. Reflector 22 is movable in a direction parallel to the x-axis, as shown in FIG. 1, by means of a motor and drive coupling (not shown). The mirrored face of reflector 22 is disposed at a fixed angle with respect to stage 12 such that light, travelling vertically upward from the stage or the reflectors 14, 16, 18, or 20, is reflected along a second position-changeable optical axis segment 25, lying in a plane (the "optical plane") parallel to and above the plane defined by the stage.

A second movable reflector 26 is attached to a slide 28 and is movable in a direction parallel to the y-axis by means of a motor and drive coupling (not shown). The reflective face of reflector 26 is oriented so as to receive light reflected from reflector 22 and to again reflect such light along the optical axis segment 29, within the optical plane.

Stationary reflector 30 is positioned within the optical plane and oriented such that light transmitted from reflector 26 is reflected from the surface of reflector 30 at a predetermined angle and along an optical axis segment 31 within the optical plane.

Two separate movable reflectors 32 and 34 are attached to a single slide 36 and are jointly movable in a direction parallel to the x-axis by means of a motor and drive coupling (not shown). Reflector 32 is oriented such that light transmitted from reflector 30 is reflected at a predetermined angle within the optical plane and along the axis segment 33 toward reflector 34. Reflector 34 is oriented such that light transmitted from reflector 32 is also reflected at a predetermined angle within the optical plane, along the axis segment 35.

A second stationary mirror 38 is positioned within the optical plane, juxtaposed to reflector 30, and oriented such that light transmitted from reflector 34 is reflected from the surface of reflector 38 at a predetermined angle and along an axis segment 39 also within the optical plane.

It can be seen from the drawing of the preferred embodiment shown in FIG. 1 that the simplest and most efficient configuration for the above described reflectors is one in which each reflector reflects light within the optical plane at an angle of 90 degrees with respect to an incident beam of light. In other words, a light ray emanating from reflector 22 is reflected from the surface of movable reflector 26 at an angle of 90 degrees with respect to the incident ray, and within the optical plane. Likewise, the incident beam emanating from reflector 26 is reflected at an angle of 90 degrees by reflector 30, and remains within the optical plane. This reflected beam is again reflected at an angle of 90 degrees by movable reflector 32, and again reflected at an angle of 90 degrees by movable reflector 34, all within the optical plane. As shown, the beam is further reflected at an angle of 90 degrees by stationary reflector 38 such that the beam emanating from the surface of reflector 38 is collinear with and similarly directed as the beam reflected by reflector 26.

Once reflected from reflector 38, the light passes through a focusing lens 40, which acts to collect the reflected light from reflector 38 and direct it, via a pair of stationary reflectors 42 and 44, into the aperture of a video, CCD or other suitable camera 46. More particularly, reflector 42 is oriented such that light from lens 40 is reflected at a predetermined angle within the optical plane, and transmitted to another stationary reflector 44. Reflector 44 lies within the optical plane and is oriented such that light transmitted from reflector 42 is subsequently reflected into the aperture of camera 46. The optical axis between lens 40 and camera 46 is folded into three segments 41, 43 and 45, respectively, to accommodate the focal characteristics of lens 40 and camera 46 while allowing convenient yet compact positioning of the various apparatus components.

Figure 2:
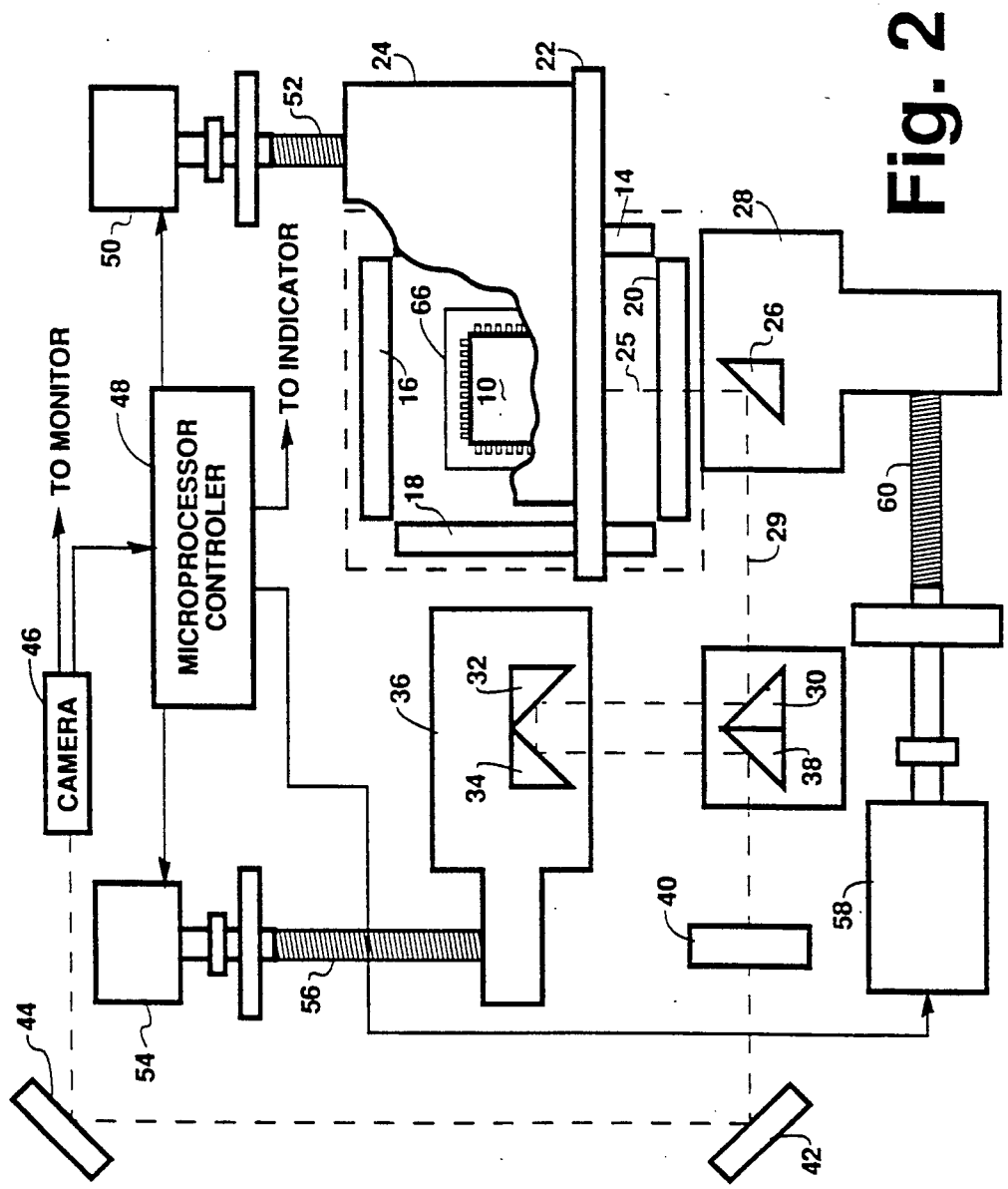
FIG. 2 is a top plan view of a preferred embodiment of the present invention, detailing the interrelationships between various components, including the interrelationships between the mechanical and optical components, and the controller.

Referring now to FIG. 2, the control features and mechanical interrelationships are shown between the various components of the present invention. A microprocessor/controller 48 is shown, one output of which is connected to the input of a stepper motor 50. Motor 50 is coupled to slide 24 by means of a drive coupling 52. A second output from the controller is connected to the input of a second stepper motor 54. Motor 54 is likewise coupled to slide 36 by means of a drive coupling 56. A third output from the controller is connected to the input of a third stepper motor 58, which is coupled to slide 28 by means of a drive coupling 60. An output from camera 46 is connected to the input of controller 48.

Shown in FIG. 3 is a detail of the stage, device illumination and physical casing of the preferred embodiment. A top casing 62 is provided which contains the majority of the reflectors and the mechanical components of the present invention. This includes the three stepper motors 50, 54, and 58, the movable reflectors, 22, 26, 32, and 34, the slides, 24, 28, and 36, the stationary reflectors 30, 38, 42 and 44, and the camera 46. A bottom casing 63 houses stage 12, device 10, and stationary reflectors 14, 16, 18, and 20. An opening 64 is provided in the bottom of casing 62 to allow optical access to the stage, device and reflectors by movable reflector 22.

As will be more fully explained below, controller 48 is programmed to cause a scanning of the inspected device 10 by energizing motors 50 and 58 in a coordinated fashion such that the reflectors 22 and 26 sequentially change the position of the axis segments 21 (see also FIG. 1) and 25 respectively to reflect light from particular portions of the inspected device into the optical plane and along axis segment 29. At the same time, motor 54 is actuated by controller 48 to move reflectors 32 and 34 in or out, as required, to maintain the length of the optical axis between lens 40 and the inspected device constant. This of course ensures that the inspected device is always "in focus".

As can be seen by reference to FIG. 3, device 10 is centered on stage 12 and placed over a translucent light diffuser 66. Stage 12 has a highly polished, reflective upper surface 68, and is provided with an opening 70 through its center, in which diffuser 66 is disposed. Diffuser 66 is a translucent white block of acrylic which extends upwardly through an opening 70 in stage 12. The central portion 71 of diffuser 66 is raised above surface 68 to provide a pedestal for supporting the body of the device 10. The balance of the exposed surface extends outwardly far enough such that the outer limits of all leads of the inspected device lie within the boundaries of the exposed surface of the diffuser when the device is in its normal position on stage 12. The diffuser is designed and constructed to produce a uniform light intensity distribution which emanates upwardly and laterally outwardly from beneath device 10 so that all device edges of interest are sharply defined. A light 72 provides the source of illumination transmitted by diffuser 66.

Supports 74 and 76 are provided to maintain stage 12 in its operational position underneath opening 64. An opening 78 is provided through the bottom of casing 63 to allow passage of light from source 72 to diffuser 66. As previously described, reflectors 16 and 20, and, 14 and 18 (FIGS. 1 and 2) surround stage 12 and device 10 in a manner enabling the symmetric transmission of light emanating laterally from each quadrant of device 10 to reflective surface 68 and thence to reflector 22 above.

Referring to FIG. 4a, the operation of the present invention will now be described in detail. As indicated above, the main functional objects of the apparatus are to measure coplanarity, lead spacing and tweeze, utilizing only one camera, while leaving the camera and device 10 stationary. This object is achieved by using movable reflectors 22 and 26 to scan different portions of device 10, either directly or through reflection from surrounding stationary reflectors 14, 16, 18 and 20. System focal length is maintained constant by means of the movable reflectors 32 and 34 under control of controller 48.

Both lead spacing, illustrated in FIG. 4b, and coplanarity, illustrated in FIG. 4c, are measured using the light reflected from the reflectors 14, 16, 18 or 20. Referring back to FIG. 4a, reflector 26 begins the measurement process in a stationary position, depicted as "A" in the Figure, and is aligned with reflector 14 such that light from beneath device 10 reflected by reflectors 14 and 22 is subsequently reflected by reflector 26 within the optical plane, and at a predetermined angle, as described above. While reflector 26 remains stationary, reflector 22, under control by controller 48, is caused to traverse opening 64. As reflector 22 moves the opening, and scans along the length of device 10, the entire side of the device that faces reflector 14 is revealed to reflector 26.

As previously suggested, device 10 is illuminated from beneath by diffuser 66. Light emanating from beneath the device, both direct and by reflection from reflective surface 68, travels along a path "a", from the device to reflector 14, and thence along a path "b", from reflector 14 up to reflector 22, and then along path "c", from reflector 22 across to reflector 26. As reflector 22 traverses the length of device 10, light from the portion of the device lying immediately beneath reflector 22, is reflected up to reflector 22 by reflector 14 and transmitted to reflector 26. Thus, the entire side of the device facing reflector 14 is, during the course of the scan, exposed to camera 46 via the combination of reflectors lying both beneath and within the optical plane.

After scanning the side of the device facing reflector 14, reflector 22 comes to rest over reflector 20, as shown by ghost lines in FIG. 4a. In the next sequence of measurement, reflector 22 remains stationary, and reflector 26 is caused to traverse the width of device 10 in the direction illustrated by "B" in the Figure. Light from the device travels along a path "d", from the device and from the device's reflection on reflective surface 68, to reflector 20, along a path "e", from reflector 20 up to reflector 22, and then along a path "f", across from reflector 22 to reflector 26. As reflector 26 traverses the width of device 10, the entire side of the device facing reflector 20 is likewise exposed to camera 46 via the combination of reflectors lying both beneath and within the optical plane.

Upon completion of the scanning of the side of the device facing reflector 20, reflector 26 is brought to rest at a position depicted as "C" in the Figure, and is aligned with reflector 18 such that light reflected from reflector 18 by reflector 22 is subsequently reflected by reflector 26 within the optical plane, and at a predetermined angle, as described above. As reflector 26 remains stationary, reflector 22 is caused by controller 48 to traverse the length of the device in the direction as indicated by the broken arrows in FIG. 4a. In this manner, the side of device 10 facing reflector 18 is exposed to reflector 26 and camera 46 in a manner as detailed above.

Next, reflector 22 is brought to rest over reflector 16. While reflector 22 remains stationary, reflector 26 is caused to traverse the width of device 10 in the direction as indicated by "D" in FIG. 4a. In this manner, the side of device 10 facing reflector 16 is exposed to camera 46 as detailed above.

Referring now to FIG. 4b, as a given side of device 10 is exposed to camera 46, microprocessor/controller 48 measures the spacing between adjacent leads and/or calculates the distance between the centerlines of individual juxtaposed leads of the device. This provides measurements of lead spacing between each lead and its immediate neighbor around the entire perimeter of the device.

Referring now to FIG. 4c, as a given side of device 10 is exposed to camera 46, microprocessor/controller 48 also determines a measurement of coplanarity of the device leads. This measurement is made utilizing both light emanating directly from beneath device 10, and from the reflection of device 10 on the reflective surface 68 of stage 12. By using this surface reflection as a component in measuring coplanarity, accuracy is greatly enhanced. The distance between the lower extremity of each individual lead and its respective reflection on surface 68 is measured and compared with similar measurements of the other leads of the device by the microprocessor/controller 48. Uniformity of downward extension among the leads is then determined by the microprocessor as a measure of device lead coplanarity.

Referring now to FIGS. 5a and 5b, the measurement of tweeze as performed by the present invention is depicted. The tweeze measurement differs from the measurements previously described in that tweeze is measured without using the four stationary surrounding reflectors 14, 16, 18, and 20. Instead, tweeze is measured from directly above device 10 using only reflectors 22 and 26 to scan the device. With reflector 26 in a stationary position as depicted by "E" in FIG. 5a and aligned with the edge of device 10 that faces reflector 14, reflector 22 is caused, via control by controller 48, to traverse the length of the device. Light from diffuser 66 travels directly upward from beneath the device to reflector 22, along a path "g", and along a path "h", from reflector 22 across to reflector 26. As described in detail above, in reference to the measurements of coplanarity and lead spacing, as reflector 22 scans along the length of device 10, the entire top side of the device which is juxtaposed to and parallel with reflector 14 is exposed to reflector 26 and subsequently to camera 46.

When reflector 22 has completed traversing the length of the device, it comes to rest and remains stationary, positioned above the edge of the device closest to reflector 20, as shown by ghost lines 22' in FIG. 5a. Reflector 26 is now caused by microprocessor/controller 48 to traverse the width of device 10 in the direction indicated by arrow "a". This allows the entire side of device 10 closest to reflector 20 to be exposed to reflector 26 and camera 46.

After reflector 26 has scanned along the width of device 10, it comes to rest and remains stationary in the position depicted as "G", in FIG. 5a. Reflector 22 is then caused to traverse the length of the device in the direction indicated by the broken arrows, as shown in the Figure. This allows the entire side of the device closest to reflector 18 to be exposed to camera 46.

When reflector 22 completes scanning the length of device 10, it comes to rest over the end of the device closest to reflector 16. Reflector 26 is then caused to traverse the width of the device in the direction as indicated by the arrow "b" in FIG. 5a. This allows the entire side of the device closest to reflector 16 to be exposed to camera 46.

As shown in FIG. 5b, tweeze is measured between the outermost extremities of corresponding leads located directly across from and on opposite sides of the device. The microprocessor/controller 48 uses the information transmitted by camera 46 and correlates this information to determine the tweeze measurements.

Referring back to FIG. 4a, the automatic focal length control of the present invention will be described. In order to ensure that accurate measurements are made during the scanning of device 10, it is necessary to maintain a constant focal length between camera 46 and the device 10. This is achieved by moving slide 36, which supports reflectors 32 and 34, back and forth in the directions as indicated by arrow "g" in the Figure. As is illustrated, by moving reflectors 32 and 34 in this manner, the optical pathlength between lens 40 and reflector 26, shown in the figures by dotted lines, is lengthened or shortened to accommodate changes in the length of the optical path between reflector 26 and device 10. Specifically, path segments 31 and 35, as shown in FIG. 1, are lengthened or shortened by movement of the reflectors via common slide 36. As an example, when reflector 22 is being moved in the direction indicated by the solid arrows in FIG. 4a, reflectors 32 and 34 are moved in the same direction a distance determined by controller 46 as necessary to maintain a constant focal length between lens 40 and device 10. In the presently described embodiment, reflectors 32 and 34 would normally be moved half of the distance that reflector 22 is moved.

Likewise, when reflector 22 is stationary, and it is reflector 26 that is being moved, by moving reflectors 32 and 34 back and forth, the optical pathlength is maintained constant. As reflector 26 is moved from position "A" to position "C", as shown in FIG. 4a, reflectors 32 and 34 are moved toward the ghost position as indicated in the Figure. By controlling the distance moved by the reflectors 32 and 34, in conjunction with the distance moved by reflector 26, the focal length of the system can be preserved at a constant value.

In the present embodiment, constant maintenance of the focal length is achieved via cooperation between the microprocessor/controller 48 and camera 46. Reflectors 32 and 34 are momentarily "dithered", as scanning occurs, to allow controller 48 to detect best focus and then generate constant outputs as required to maintain the focal length which provides the image of the greatest intensity. Constant communication is present between the camera and microprocessor/controller throughout the scanning process, thus providing the focal control function automatically. This allows the apparatus to perform the measurements of coplanarity, lead spacing and tweeze with a greater degree of accuracy than was possible in prior art devices.

Figure 6:
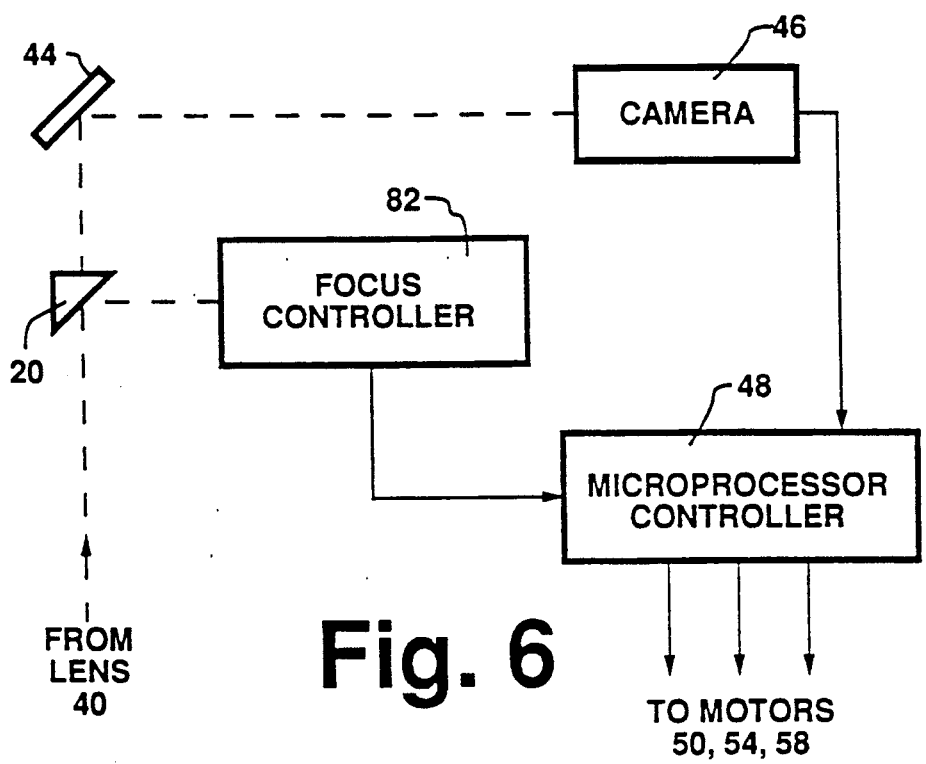
FIG. 6 is a block diagram showing an alternative embodiment of the focal length control portion of the preferred embodiment of the present invention.

An alternative to use of the camera image intensity as a focal length control determinant is suggested in FIG. 6 and may include an independent focus controller which separately determines focus and provides a control input to the microprocessor/controller. One such system is described in U.S. Pat. No. 4,347,001, the relevant disclosure of which is hereby incorporated by reference. In use of such a system, beam splitter 80 would be placed in the optical path after the lens and focal length adjustment section of the apparatus to allow optical communications with the imaged surface through the lens system. In the preferred embodiment, the beam splitter would be placed between reflector 42 and reflector 44 to allow a laser beam to be projected off axis through the lens 40 to the imaged surface where it is reflected back through lens 40 and deflected by splitter 80 onto a detector (not shown) which generates a control signal for input to the microprocessor/controller 48. The microprocessor/controller then sends signals to motor 54 operative to move reflectors 32 and 34 in or out to control the focal length.

Figure 7A:
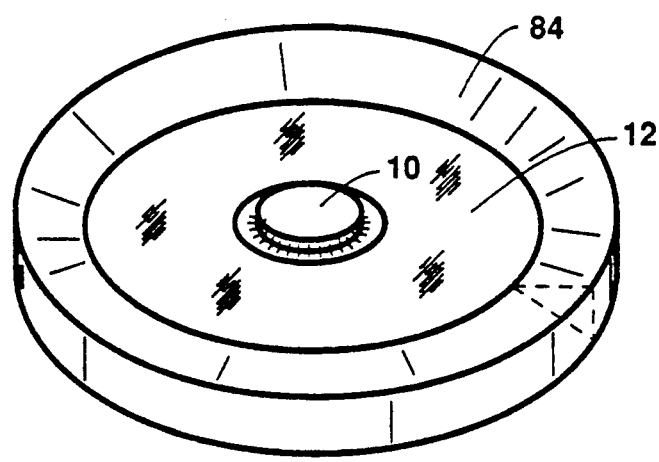
FIG. 7a is a perspective view of an alternative embodiment of the stage and stationary mirror in accordance with the present invention.
Figure 7B:
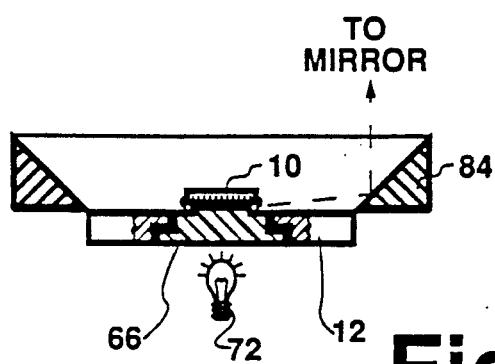

Referring now to FIGS. 7a and 7b, shown is an alternative reflector configuration for use with a semiconductor device having a circular shape. Device 10 is situated in the center of stage 12 and surrounded by circular reflector 84. As shown in the cross-sectional view of FIG. 7b, the reflective surface of reflector 84 is of frusto-conical configuration, and angled with respect to stage 12 such that light transmitted from device 10, or reflected from surface 68, is reflected substantially vertically upward therefrom and used as described above. Similarly, elliptical, hexagonal, octagonal, etc. shaped reflectors could be used to inspect like configured semiconductor devices.

Whereas the preferred embodiment of the present invention has been described above, it is contemplated that other alternatives and modifications may become apparent to those skilled in the art after having read the above disclosure. It is therefore intended that the appended claims be interpreted as covering all such alterations and modifications as fall within the true spirit and scope of the invention.

What is claimed is:

1. Apparatus for optically inspecting physical characteristics of a leaded surface mounted semiconductor device, such as lead spacing, coplanarity and tweeze, comprising:
   a reflective stage for posturing said semiconductor device for inspection, including a light diffuser means disposed through the center thereof for illuminating said device from underneath;
   first stationary reflector means, disposed around said device on a first reference plane defined by said stage and further disposed at an angle with respect to said first plane, for reflecting light, transmitted from said device or said stage, vertically upward;
   first movable reflector means disposed above said first reference plane for receiving and reflecting said light transmitted vertically upward, and operative to traverse said first reference plane within a second reference plane, parallel thereto, from a first end of said first stationary reflector means to a second end of said first stationary reflector means;
   second movable reflector means disposed within said second reference plane for receiving and reflecting light reflected from said first movable reflector means, and operative to traverse the length of said first movable reflector means such that the entire reflective surface thereof can be scanned;
   camera means for receiving light originating from beneath said device;
   focal length control means disposed within said second reference plane for maintaining a constant focal length between said camera and said device;
   means for effectuating the movement of said movable reflector means; and
   microprocessor means for controlling the movement of said first and second movable reflector means and for controlling said focal length control means, and further for receiving an output from said camera and using said output to determine the relevant characteristics of said device.

2. The apparatus as described in claim 1 further comprising: lens means disposed within said second reference plane for collecting and focusing light originating from beneath said device and transmitted to said camera.

3. The apparatus as described in claim 1 wherein said focal length control means comprises:
   second stationary reflector means disposed within said second reference plane for receiving and reflecting light reflected from said second movable reflector means;
   third and fourth movable reflector means operatively coupled together and disposed within said second reference plane, said third movable reflector means for receiving and reflecting light reflected from said second stationary reflector means, and said fourth movable reflector means for receiving and reflecting light from said third movable reflector means, said third and fourth movable reflector means being further disposed such that incident light received and reflected by said third movable reflector means is reflected by said fourth movable reflector means along a path parallel to and oppositely directed to said incident light, said third and fourth movable reflectors being operative, when moved, to lengthen or shorten said focal length;
   third stationary reflector means disposed within said second reference plane for receiving and reflecting light reflected from said fourth movable reflector means and further disposed such the distance between said second stationary reflector means and said third movable reflector means is equal to the distance between said third stationary reflector means and said fourth movable reflector means; and
   further means for effectuating the movement of said third and fourth movable reflector means.

4. Apparatus as described in claim 1 wherein said light diffuser means is made of an acrylic, translucent white material and is operative to provide a uniform light intensity distribution from underneath said device.

5. Apparatus as described in claim 1 wherein said means for effectuating movement of said movable reflector means comprises:
   first slide means connected to said first movable reflector means and further connected to a first microprocessor controlled motor means such that said first movable reflector means can be made to traverse said first reference plane; and
   second slide means connected to said second movable reflector means and further connected to a second microprocessor controlled motor such that said second movable reflector means can be made to traverse the length of said first movable reflector means.

6. Apparatus as described in claim 3 wherein said further means for effectuating movement of said third and fourth movable reflector means comprises:
   third slide means connected to said third and fourth movable reflector means and further connected to a third microprocessor controlled motor such that said third and fourth movable reflectors can be made to move together effectively lengthening or shortening said focal length.

7. Apparatus for optically inspecting physical characteristics such as lead spacing, coplanarity and tweeze of leaded, surface mounted semiconductor devices, comprising:
   a stage for posturing a semiconductor device for inspection, and including light means for illuminating said device;

first stationary reflector means disposed around said device for reflecting light transmitted from said device vertically upward;

first movable reflector means disposed in a plane located above said first reflector means for receiving and reflecting said light transmitted vertically upward, and movable in a first direction between a position above one side of said first stationary reflector means to a position above the opposite side thereof;

second movable reflector means disposed in said plane for receiving and reflecting said light reflected thereonto by said first movable reflector means, and movable in a second direction orthogonal to said first direction and relative to said first movable reflector means such that light transmitted from all sides of said device can be scanned;

camera means for receiving said light after it is reflected from said second movable reflector means and operative to develop image signals commensurate therewith;

focal length maintenance means for maintaining a constant focal length between said camera and said device as said first and second movable reflector means are moved relative to each other; and microprocessor means for controlling the movement of said first and second movable reflector means and for controlling said focal length maintenance means, said microprocessor means being responsive to said image signals and operative to determine said physical characteristics of said device.

8. The apparatus as described in claim 7 further comprising lens means disposed between said camera means and said second movable reflector means for collecting and focusing light reflected from said second movable reflector means for input to said camera means.

9. The apparatus as recited in claim 7 wherein said microprocessor means is further operative to determine from said image signals the degree of focus of the light input to said camera means and to generate an output signal for driving said focal length maintenance means.

10. The apparatus as recited in claim 7 wherein said focal length maintenance means includes second and third stationary reflector means and third and fourth movable reflector means, said second stationary reflector means being disposed to reflect light transmitted thereto from said second movable reflector means and onto said third stationary reflector means via said third and fourth movable reflector means and thence into the input optical axis of said camera means.

11. The apparatus as recited in claim 7 wherein said first stationary reflector means includes four 90-degree reflectors disposed to lie in substantially the same plane as said stage whereby each said 90-degree reflector reflects upwardly light radiating outwardly from a different side of said device.

12. The apparatus as recited in claim 7 wherein said stage includes a reflective surface and wherein said light means includes a light-diffusing pedestal extending upwardly through said surface and serving as a means for supporting said device, said light-diffusing means causing light of substantially uniform intensity to radiate outwardly from beneath said device.

13. The apparatus as recited in claim 10 and further comprising first electrical drive means responsive to signals generated by said microprocessor means and operative to drive said third and fourth movable reflector means relative to said second and third stationary reflector means, and second and third electrical drive means responsive to signals generated by said microprocessor means and operative to drive said first and second movable reflector means in said first and second directions, respectively, as required to sequentially reflect light from all points along each side of said device.

14. Apparatus for optically inspecting leaded surface-mounted semiconductor devices comprising:

stage means for posturing a semiconductor device for inspection and including light means for illuminating said device;

first movable reflector means disposed above said stage means for receiving and reflecting light transmitted upwardly from said device, and movable in a first direction between a position above one side of said device to a position above the opposite side thereof;

second movable reflector means for receiving and reflecting light received from said first movable reflector means, and movable in a second direction orthogonal to said first direction and relative to said first movable reflector means such that light transmitted from all sides of said device can be scanned;

camera means for receiving said light after it is reflected from said second movable reflector means and operative to develop image signals commensurate therewith;

focal length maintenance means for maintaining a constant focal length between said camera and said device as said first and second movable reflector means are moved relative to each other; and microprocessor means for controlling the movement of said first and second movable reflector means and for controlling said focal length maintenance means, said microprocessor means being responsive to said image signals and operative to determine physical characteristics of said device.

15. Apparatus as recited in claim 14 and further comprising lens means disposed between said camera means and said second movable reflector means for collecting and focusing light from said device for input to said camera means.

16. The apparatus as recited in claim 14 wherein said microprocessor means is further operative to determine from said image signals the degree of focus of the light input to said camera means and to generate an output signal for driving said focal length maintenance means.

17. The apparatus as recited in claim 14 wherein said focal length maintenance means includes first and second fixed reflector means and third and fourth movable reflector means, said first fixed reflector means being disposed to reflect light transmitted thereto from said second movable reflector means and onto said second fixed reflector means via said third and fourth movable reflector means and thence into the input optical axis of said camera means.

18. The apparatus as recited in claim 14 wherein said stage includes a reflective surface and wherein said light means includes a light-diffusing pedestal extending upwardly through said surface and serving as a means for supporting said device, said light means causing light of substantially uniform intensity to radiate outwardly from beneath said device and through the leads thereof.

19. The apparatus as recited in claim 14 and further including stage-mounted reflector means disposed around said device for reflecting light transmitted from beneath the sides of said device vertically upward toward said first movable reflector means whereby movement of said first and second movable reflector means allows each side of said device to be viewed by said camera means.

20. Apparatus as recited in claim 19 and further comprising lens means disposed between said camera means and said second movable reflector means for collecting and focusing light from said device for input to said camera means.

21. The apparatus as recited in claim 19 wherein said microprocessor means is further operative to determine from said image signals the degree of focus of the light input to said camera means and to generate an output signal for driving said focal length maintenance means.

22. The apparatus as recited in claim 19 wherein said focal length maintenance means includes first and second fixed reflector means and third and fourth movable reflector means, said first fixed reflector means being disposed to reflect light transmitted thereto from said second movable reflector means and onto said second fixed reflector means via said third and fourth movable reflector means and thence into the input optical axis of said camera means.

23. The apparatus as recited in claim 19 wherein said stage includes a reflective surface and wherein said light means includes a light-diffusing pedestal extending upwardly through said surface and serving as a means for supporting said device, said light means causing light of substantially uniform intensity to radiate outwardly from beneath said device and through the leads thereof.

* * * * *